United States Patent [19]

Best et al.

[11] 4,434,474
[45] Feb. 28, 1984

[54] SINGLE PIN TIME-SHARING FOR SERIALLY INPUTTING AND OUTPUTTING DATA FROM STATE MACHINE REGISTER APPARATUS

[75] Inventors: David W. Best, Marion; Jeffrey D. Russell, Cedar Rapids, both of Iowa

[73] Assignee: Rockwell International Corporation, El Segundo, Calif.

[21] Appl. No.: 264,177

[22] Filed: May 15, 1981

[51] Int. Cl.³ .......................... G11C 11/40; H04L 7/02
[52] U.S. Cl. .................................... 364/900; 377/64
[58] Field of Search ... 364/200 MS File, 900 MS File; 235/92 SH; 365/221; 370/112, 58; 371/57; 377/54, 57–58

[56] References Cited

U.S. PATENT DOCUMENTS

| | | | |
|---|---|---|---|
| 3,573,754 | 4/1971 | Merryman | 377/64 |
| 3,862,435 | 1/1975 | Salters et al. | 377/68 |
| 4,222,166 | 9/1980 | Groves | 364/900 |
| 4,333,089 | 6/1982 | Leininger | 364/200 |
| 4,387,341 | 6/1983 | Martinson | 377/73 |

*Primary Examiner*—Gareth D. Shaw
*Assistant Examiner*—Daniel K. Dorsey
*Attorney, Agent, or Firm*—Bruce C. Lutz; Howard R. Greenberg; H. Fredrick Hamann

[57] ABSTRACT

Synchronously clocked gating apparatus is illustrated for time multiplexing signals into and out of a register simultaneously whereby a single pin can be utilized for the two sets of data transfer rather than the two pins required in the prior art.

7 Claims, 2 Drawing Figures

SINGLE PIN TIME-SHARING FOR SERIALLY INPUTTING AND OUTPUTTING DATA FROM STATE MACHINE REGISTER APPARATUS

INVENTION

The present invention is generally concerned with electronics and more specifically concerned with register based state machines. Even more specifically, it is concerned with apparatus for inputting and outputting data from a serial shift register using a single interface terminal with respect to ground or reference potential.

In the prior art, inputting data to and retrieving data from a serial shift register, has required the use of at least two I/O pins with respect to ground. The ground or reference terminal is utilized for many other purposes in most state machines and thus is not used in the indicated terminology of requiring one or two terminals for discussion purposes throughout this application and including the claims.

Prior art machines have used a single terminal for inputting and outputting data from a single stage of a parallel loaded and output register but it is believed that such prior art tactics are not relevant in that all the data to be transferred out is transferred at one increment of time and all the data to be input is transferred during a different increment of time as concerns that particular word. Moreover, the problems of timing and otherwise of parallel operated registers are completely different from those involved with serial shift type registers such as involved in the subject matter of the present invention.

The present invention accomplishes the desired result by utilizing a synchronous clock which operates the gating mechanisms and the shifting of a register on both sides of the single pin interface. The clock is first used to actuate a gate which relays the data bit in the final position within the shift register to the interface pin and accordingly the data is output from the device. When the clock changes, gating is effective to apply incoming data to the interface pin and then to the input of the shift register. The next change of clock actuates the shift register to transfer all the data within the shift register by one bit and simultaneously input the data presently being applied at the input. The process is then repeated until all the old data is shifted out and the desired new data is shifted into the shift register.

In view of the above, it is the general object of the present invention to reduce the number of interface pins required for transfer of data to and from a shift register.

Other objects and advantages of this invention may be ascertained from a reading of the specification and appended claims in conjunction with the drawings wherein:

FIG. 1 is a schematic block diagram of the inventive concept; and

FIG. 2 comprises a set of waveforms used in explaining the operation of FIG. 1.

DETAILED DESCRIPTION

Figure 1:
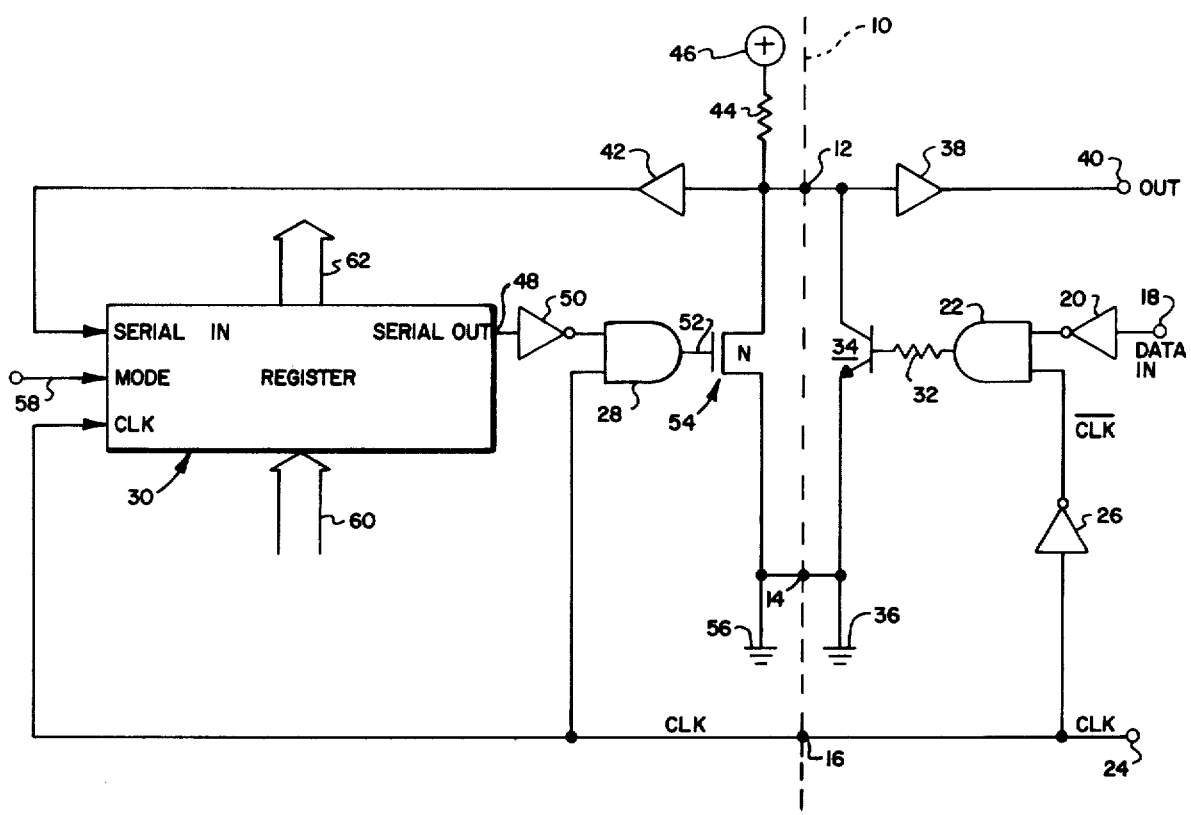

In FIG. 1 a dash line, generally indicated as 10, operates to define an interface between two sets of electronic circuitry. As part of the interface 10, there are shown I/O terminals 12, 14, and 16, which perform the functions of data pin interfacing means, ground or reference potential interfacing means and clock signal interfacing means respectively. Data is input on a lead 18 to an inverter 20 and to an AND gate 22. Clock signals are input on a lead 24 and through an inverter 26 to a second input of gate 22. The clock signals appearing on lead 24 are also applied to clock interface 16 and from there to an AND gate 28 and to an input of a data bit or control bit register generally designated as 30. Output signals from AND gate 22 are supplied through a resistor 32 to a gating device such as NPN transistor 34, connected between terminal 12 and a ground or referenced potential 36, which as shown is connected to terminal 14. Terminal 12 is also connected through a buffer 38 to an apparatus serial data output terminal 40. Terminal 12 supplies incoming data through a further buffer 42 to a serial input terminal of register 30. Terminal 12 is also connected through a resistor 44 or other logic value pull-up means such as a FET to a positive power potential 46. An output of the register 30, in serial format, appears at terminal 48 and is applied through an inverter 50 to a second input of the AND gate 28. An output of AND gate 28 appears on lead 52 to a gate of an N channel FET transistor 54, connected between ground 56 and the terminal 12. Ground 56 is connected, as shown, to reference terminal 14. The register 30 as illustrated operates either in the parallel mode or serial shift mode and accordingly has a mode control terminal 58, as well as parallel data input leads 60 and parallel data output leads 62.

Figure 2:
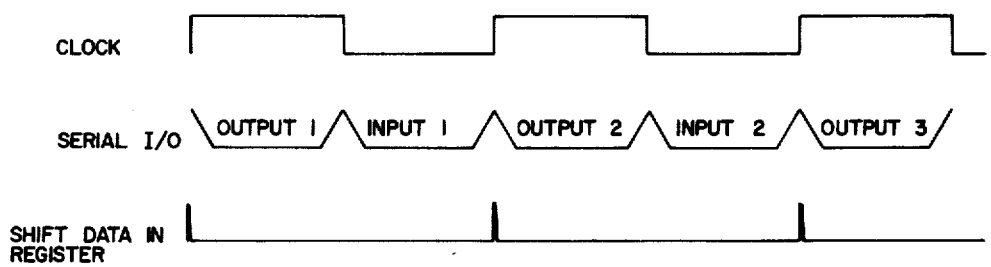

Referring to FIG. 2, it will be noted that the uppermost waveform shows the clock signal, which shows that as the clock is in a logic one or high condition, the gating is actuated to the data output condition as illustrated in the second waveform. When the clock is in a logic zero or low condition, data is input through the gating mechanism of FIG. 1. At the point when the clock changes from a low or logic zero condition to a high or logic one condition, the clock is received by register 30, for the purpose of receiving the data, being applied thereto from buffer 42. In addition to causing register 30 to accept serial input data, the clock also operates to shift the data within the register 30 from left to right. Reference times in the forgoing are illustrated by the symbolic lowermost waveform in FIG. 2. (This waveform is presented for descriptive clarity and is not used as such.)

OPERATION

As previously indicated, the normal way in which signals are transmitted to and from a register, operating in some type of state machine is through the use of two separate interface pins, each operating with respect to reference potential or ground. Further, although the idea of time multiplexing has been utilized for parallel operated registers, these multiplex conditions are for a single data bit position within the register and all the information in that position is output at times substantially unrelated to times that data is input. In the present method, the direction of data transfer is "encoded" within a synchronization signal and the data is transferred between two serial memories. We believe this to be a novel and unique application of multiplex serial data transfers.

Before continuing, it is necessary that certain clauses or words be defined. For the purposes of this specification, a "state" is a single group or set of logic values. A "state machine" is a device which can assume more than one set of logic values. A "register based state machine" is a state machine or other device in which the current (present) state is held in a register and the current state is replaced by the next state at a given increment in time as determined by a master timing signal which procedurely increments the logic states of the device in a manner as determined from the current machine state. A "register" is a device for holding a group or set of logic values for a period of time as determined by the design of the register.

In accordance with the above, it is to be realized that modern computers utilizing state machines are becoming so complex and being integrated into such small architectural areas, such as single chips of silicon, that it becomes necessary to utilize the input and output pins (I/O) of the state machine package with great efficiency, so as to minimize the number of pins and therefore reduce the overall size of the computing device. The device, described herein, accomplishes the method of utilizing a single I/O pin as both an input and an output, in a multiplex manner, so as to transfer data both to the state machine as well as receive data from the state machine, in a simultaneous manner.

To perform the multiplex transfer of data, both of the communicating devices must maintain synchronization with each other, so that when one device is sending data, the other device is receiving data, and vice-versa. In accordance herewith, synchronization is derived by a common clock signal which controls the sending and receiving of both devices. Data is then multiplexed by one device transmitting data when the clock is in a given logic state such as a logic one or high state and the second device transmitting data when the clock is in a second logic state, such as the low or logic zero as illustrated in FIG. 2.

The present invention has been incorporated into a register based state machine which is normally operated in the parallel data in and the parallel data out mode but which for testing purposes is operated in a serial shift register manner as detailed more fully in our co-pending application Ser. No. 264,179 filed on the same date as the present application and assigned to the same assignee. To accomplish the desirable function of minimizing the number of I/O pins, it was desirable to provide simultaneous reading and writing of the serial shift register within the integrated circuit. For the purposes of testing, it was desirable to read the contents of the register, as well as replace the existing contents with a new predetermined or predefined control bit pattern.

As illustrated in FIG. 1, the serial output of shift register 30 is inverted by inverter 50 to form a signal which is applied to AND gate 28, the second input to this gate, from the clock lead applied at pin 16, is used to gate the signal to an N channel FET 54. FET 54 has the effect of connecting the I/O line as represented by terminal 12 to the signal 56 when the signal at the gate of FET is at a logic one. If the gate signal is a logic zero, the FET 54 will appear as a open circuit and the I/O line as represented by terminal 12 will be pulled to the logic one state by resistor 44, which is connected to positive potential 46. Thus, it is a simple matter to determine when the clock signal of terminal 16 is in a logic one state, the logic value of the data signal output at 48 of register 30 will be present on the I/O line at 12 and can be received by the signal buffer 38. When the clock is in the logic zero state, the serial shift register output data at 48 will have no effect on the gate of FET 54, since it will not be passed through AND gate 28, and the I/O line will be pulled high by resistor 44, when FET 54 is not in an actuated condition.

The apparatus on the right hand side of FIG. 1 presents data on lead 18 to be loaded into the serial shift register 30, by applying this data to inverter 20, whose output is used as one of the inputs to AND gate 22. The synchronization clock is inverted by inverter 26, the output of which is used as a second input to AND gate 22. The output of gate 22 is then used as a control signal to some type of gate such as NPN transistor 34 which is connected to the I/O line as represented by terminal 12 in a common emitter fashion. The resistor 32 is used to limit the base current from gate 22 to the transistor 34. In a manner similar to that previous described, the logic value of the data used as input to the inverter 20, will be present on the I/O line after being passed through buffer 42, when the synchronization clock is a logic zero. This data is then used as the serial input to the serial shift register 30. That register is clocked on the rising edge of the synchronization clock, at the time shown in the lower waveform on FIG. 2. This causes the serial input data to be latched within register 30 and shifts the entire register contents one bit to the right thereby presenting the next register bit to be output at terminal 48.

The process then repeats itself continuously until all the data is loaded into the register and all the data to be retrieved is output on lead 40. As will be observed, it is desirable to have the synchronization clock under the control of the device which sends and receives data to and from the register based state machine or computing device. This allows the computing device to be manipulated in a test mode by an external test device in a manner described in more detail in the co-pending referenced application. The serially operating shift register 30 is normally loaded in the parallel mode using the leads 60 and 62 as previously referenced and requires the use of a test control signal, as appears on lead 58, to place it into the serial or shift mode. This signal also may operate within the register 30 on gating circuitry, so that the shift register will be under the exclusive control of the external clock while in the shift mode.

While the blocks 20, 22 and 26 are shown as separate components for the purposes of clarity in explanation of operation, these three components can easily be combined into a single NOR gate and operate in a logically identical fashion. As is also apparent, the buffers 42 and 38 are inserted primarily for an efficient operational approach to circuit design and can be eliminated from an electrical standpoint. The elimination of such buffers will not destroy the inventive concept.

Thus, there are many alterations which can be incorporated into the disclosure as illustrated and still stay within the inventive concept. Thus, we wish to be limited not by the scope of the single circuit illustrated but rather by the scope of the appended claims, wherein we claim:

1. Apparatus for inputting data to and outputting data from a register through single terminal means relative a reference potential comprising, in combination:
  single terminal means;
  first means for supplying a clock signal having first and second logic states;
  second means, connected to said first means and to said single terminal means for supplying input data bits to the single terminal means only when the clock signal is in the first logic state;
  unitary register means having a plurality of a data bit storage stage, including serial data input means connected to said single terminal means, and independent serial data output means and clock means;

third means, connected between said serial data output means and said single terminal means and also connected to said first means, for supplying serial output data bits to said single terminal means when said clock signal is in the second logic state, the bits of the input and output data being supplied to said single terminal means in an interleaved fashion.

2. Apparatus as claimed in claim 1 comprising, in addition:

means connecting said first means to said register means for serially shifting the data bits within said register means between the input and output ports thereof, once for each pair of logic states of said clock signal of said first means.

3. Apparatus as claimed in claim 1 comprising, in addition:

apparatus output means connected to said single terminal means for outputting data as received from said serial data output means of said register means via said third means.

4. The method of communicating data across a single pin interface with respect to referenced potential comprising the steps of:

outputting data bits from a multi-data bit register to the serial interface during a first time increment;

inputting data bits to said register through said interface during a next adjacent time increment; and serially shifting data within said register one data bit position before repeating the above steps in a repetitious manner until all desired data is both output and input from and to the single said register respectively, the input and output data bits being time interleaved.

5. The method of simultaneously inputting and outputting data to and from a register through a single terminal interface with respect to ground comprising, the steps of:

retrieving a first output data bit from an output of a serial multi-data bit register through the single terminal interface;

supplying a first input data bit to an output of said serial register through the single terminal interface;

shifting the data bits one bit position within the register; and repeating the above steps until the register is filled with new data, the input and output data bits appearing at said single terminal interface being time multiplexed.

6. Apparatus for simultaneously inputting and outputting data bits to and from a single register through a single terminal interface with respect to reference potential comprising, in combination:

unitary multiple-data bit register means including data input means, data output means and shift signal input means;

single terminal interface means;

data output means connecting said data output of said output register means with said single terminal interface means; and data input means connecting said single terminal interface means to said input means of said register means, the input and output data appearing at said single terminal interface means being bit time multiplexed.

7. Apparatus as claimed in claim 6 comprising, in addition:

means for retrieving a first data output bit from said single terminal interface means as output by said output means of said serial register means;

means for supplying a first input bit to said single terminal interface means for application to said input means of said unitary register means; and means for connection to said shift signal input means of said register means for shifting the data bits within said register means, the retrieval and supply of data bits along with the shifting of data bits after each retrieval and supply being repeated until the register is filled with new data.

* * * * *